(12) United States Patent
Chargueraud et al.

(10) Patent No.: US 11,469,024 B2
(45) Date of Patent: Oct. 11, 2022

(54) MULTIDIMENSION-CONTROLLABLE SWITCH LEVITATION SYSTEM

(71) Applicants: Thierry Chargueraud, Paris (FR); Xiaobing Wang, Shenzhen (CN); Liangqing Li, Zhaoqing (CN)

(72) Inventors: Thierry Chargueraud, Paris (FR); Xiaobing Wang, Shenzhen (CN); Liangqing Li, Zhaoqing (CN)

(73) Assignees: Thierry Chargueraud, Paris (FR); Xiaobing Wang, Shenzhen (CN); Liangqing Li, Zhaoqing (CN)

( * ) Notice: Subject to any disclaimer, the term of this patent is extended or adjusted under 35 U.S.C. 154(b) by 0 days.

(21) Appl. No.: 17/150,732

(22) Filed: Jan. 15, 2021

(65) Prior Publication Data

US 2022/0014121 A1 Jan. 13, 2022

(30) Foreign Application Priority Data

Jul. 13, 2020 (CN) .......................... 202021359465.3
Sep. 10, 2020 (CN) .......................... 202010947434.8

(51) Int. Cl.
*H01F 7/02* (2006.01)
*H02N 15/00* (2006.01)
*F21V 33/00* (2006.01)

(52) U.S. Cl.
CPC ........ *H01F 7/0236* (2013.01); *F21V 33/0048* (2013.01); *H02N 15/00* (2013.01)

(58) Field of Classification Search
CPC ... H01F 7/0236; F21V 33/0048; H02N 15/00; H03K 17/97; H01H 36/02
See application file for complete search history.

(56) References Cited

U.S. PATENT DOCUMENTS 3,815,963 A * 6/1974 Wilk .................. H05B 6/32
                                                   310/90.5
4,585,282 A * 4/1986 Bosley ............... F16C 32/0451
                                                   310/90.5

(Continued)

FOREIGN PATENT DOCUMENTS

CN     104270035 A    1/2015
CN     204268315 U    4/2015
(Continued)

OTHER PUBLICATIONS

Japanese Patent Application No. 2021-010159, Office Action Notice of Reasons for Refusal, dated Jan. 5, 2022.

*Primary Examiner* — Mohamad A Musleh
(74) *Attorney, Agent, or Firm* — Flener IP & Business Law; Zareefa B. Flener (57) ABSTRACT

A multidimension-controllable levitation switch comprising a switch levitating body having a magnet; a magnetic levitation support mechanism for supporting the switch body in a stably levitated state relative thereto; magnetic detector means for detecting magnetic field variation of the switch body relative thereto and outputting a correspondingly varied magnetic signal; and a switch control circuit receiving the varied magnetic signal output by the magnetic detector means, and generating a corresponding switch signal based on the varied magnetic signal received. The multidimension-controllable levitation switch or switch system of the present invention may be applied to various electrical appliances, wherein the switch-shift operation of the electric device can be achieved simply by applying a push or press action on the levitating body, and thus incorporates operational convenience as well as novelty.

13 Claims, 4 Drawing Sheets

(56) References Cited

U.S. PATENT DOCUMENTS

| | | | |
|---|---|---|---|
| 11,081,269 B2* | 8/2021 | Frangen | H01F 7/0231 |
| 2004/0052029 A1 | 3/2004 | Joachim | |
| 2011/0074237 A1* | 3/2011 | Smoot | H02N 15/00 310/90.5 |
| 2011/0248807 A1 | 10/2011 | Wang et al. | |
| 2011/0273044 A1* | 11/2011 | Simon | H02N 15/00 310/90.5 |
| 2014/0321022 A1 | 10/2014 | Mori et al. | |
| 2017/0063194 A1* | 3/2017 | Puskarich | H02N 15/00 |
| 2019/0326045 A1* | 10/2019 | Dudley, Jr. | H01F 7/206 |

FOREIGN PATENT DOCUMENTS

| | | | | |
|---|---|---|---|---|
| CN | 204785621 U | | 11/2015 | |
| GB | 2389968 A | * | 12/2003 | H02N 15/00 |
| JP | 2014217125 A | | 11/2014 | |
| WO | WO-2004030198 A2 | * | 4/2004 | A63H 33/26 |

\* cited by examiner

MULTIDIMENSION-CONTROLLABLE SWITCH LEVITATION SYSTEM

FIELD OF THE INVENTION

The present invention generally relates to a switch system.

BACKGROUND OF THE INVENTION

Various switch systems are known, including manually operated physical switches such as button switches, rocker switches and touch switches, sensor control switches such as voice control switches and thermo-switches, time switches, and so on.

On certain occasions like a magnetically-levitated globe or sound box in which a bulb is built, it is quite inconvenient to operate a physical power supply switch disposed thereon since a levitating body usually rotates while being levitated. If using a conventional sensor control switch such as a voice control switch, it is susceptible to ambient noise, and a novel operational feeling therewith is almost lost nowadays.

SUMMARY OF THE INVENTION

An object of the present invention is to provide a novel switch system for an electrical appliance.

According to a first aspect of the present invention, there is provided a switch levitation system, comprising:

a switch levitating body having a magnet;

a magnetic levitation support mechanism for supporting the switch body in a stably levitated state relative thereto;

magnetic detector means for detecting magnetic field variation of the switch body relative thereto and outputting a correspondingly varied magnetic signal; and a switch control circuit receiving the varied magnetic signal output by the magnetic detector means, and generating a corresponding switch signal based on the varied magnetic signal received.

According to the present invention, the switch control circuit will generate a corresponding switch signal only when the varied magnetic signal output by the magnetic detector means exceeds a set value. The set value is greater than a disturbance value corresponding to normal and stable levitation of the switch body. In other words, in cases where there is no human interference and the switch body itself is subjected to normal ambient air disturbances, the varied magnetic signal or field strength signal detected and output by the magnetic detector means is smaller than the above set value. When forced interference is imposed on the switch body being levitated in a normally stable state or at an approximate levitation reference position, for example, when the switch body is simply pressed or pushed aside a little to deviate by an appropriate distance such as 1-2 mm, the varied magnetic signal detected and output by the magnetic detector means will be greater than or exceed the set value. Generally, the push or press in such a degree would not exceed or destroy the self-balance recovery or adjustment capability of the magnetic levitation system consisting of the switch body and the magnetic levitation support mechanism.

According to the switch levitation system of the present invention, the magnetic detector means is preferably configured to detect the magnetic field variation when the switch body is displaced in distance relative thereto. Such a displacement in distance or a distance change along Z-axis between the magnetic detector means and the switch body may be achieved by manually pressing the switch body towards the magnetic detector means (or the magnetic levitation support mechanism). Such a manual press imitates the manual operation experience of a conventional switch.

In addition, the magnetic detector means of the present invention may be further configured to detect the magnetic field variation when the switch body is displaced parallel therewith, and the parallel displacement is also achieved by pushing the switch body aside laterally or longitudinally. The magnetic field variation caused by the parallel displacement may include X-axis variation and Y-axis variation. In this case, the varied magnetic signal output by the magnetic detector means may include at least one vector signal selected from the group consisting of vector signals along the X-axis, Y-axis and Z-axis, and the switch control circuit generates a respective mode of switch control signal based on each of the output vector signals.

According to the switch levitation system of the present invention, a levitation position of the switch body is not limited in any way, and the switch body may be stably levitated in any direction of the magnetic levitation support mechanism, e.g., above, below or aside, depending on practical applications.

In the present invention, although the magnetic detector means may be otherwise arranged, it is preferably arranged stationary to the magnetic levitation support mechanism so as to facilitate detection accuracy of the system. According to a preferred embodiment of the present invention, the magnetic detector means is part of the magnetic levitation support mechanism, e.g., a Hall sensor of the magnetic levitation support mechanism also acts as the magnetic detector means. Such a configuration not only reduces the number of sensors, but also simplifies the system structure. Certainly, the magnetic detector means may also be a separate Hall sensor arranged in any other appropriate position.

According to the above preferred embodiment, the magnetic levitation support mechanism and the switch body may form a magnetic repulsion type levitation system. For example, the switch body may be stably levitated at a predetermined reference position above or aside of the magnetic levitation support mechanism. In this case, the magnet of the switch body is a permanent magnet with opposite magnetic poles, the magnetic levitation support mechanism includes a substantially annular permanent magnet, an electromagnetic coil, a magnetic sensor assembly and a controller, the annular permanent magnet of the magnetic levitation support mechanism and the permanent magnet of the switch body form a substantially repulsively balanced magnetic field, the magnetic sensor assembly is configured to detect in real time a levitation balance position deviation of the permanent magnet of the switch body from the annular permanent magnet of the magnetic levitation support mechanism, the controller controls a corresponding electric current to flow through the electromagnetic coil based on the levitation balance position deviation detected by the magnetic sensor assembly so as to return the permanent magnet of the switch body to its relative levitation balance position, and the magnetic sensor assembly of the magnetic levitation support mechanism functions also as the magnetic detector means.

Alternatively, the magnetic levitation support mechanism and the switch body may form a magnetic attraction type levitation system. For example, the switch body may be stably levitated at a predetermined reference position below the magnetic levitation support mechanism. In this case, the magnet of the switch body may be a permanent magnet with opposite magnetic poles, the magnetic levitation support mechanism includes a ferromagnetic element, an electromagnetic coil and a magnetic sensor, the ferromagnetic element and the permanent magnet of the switch body form a substantially attractively balanced magnetic field (usually having a vertical freedom), the magnetic sensor is configured to detect in real time a levitation balance position deviation between the ferromagnetic element and the permanent magnet of the switch body, a corresponding electric current is controlled to flow through the electromagnetic coil based on the levitation balance position deviation detected by the magnetic sensor so as to return the permanent magnet of the switch body to its relative levitation balance position, and the magnetic sensor of the magnetic levitation support mechanism functions also as the magnetic detector means.

It should be understood by those skilled in the art that the operation type of the magnetic levitation system of the present invention is unimportant, as long as the levitating body contains a magnet or has magnetic polarities, so that the magnetic field variation caused by the position deviation of the levitating body can be readily detected by magnetic detector means or Hall sensors.

According to the present invention, the levitating body may be designed in any desired configuration, such as a rubber eraser or a lighter or a globe or a toy of suitable sizes. In addition, the levitating body per se may also be designed as a sphere with opposite magnetic poles. In the present invention, the term "opposite magnetic poles" means that the N and S poles of the magnet are on the same straight line; the term "magnet" includes permanent magnet and electro-magnet; the term "ferromagnetic element" refers to an element made of iron or permanent magnet and can be attracted by other magnets. The terms "above or below", "longitudinally", "laterally", "aside" etc., are also used for convenient description of corresponding drawing figures.

According to another aspect of the present invention, an electrical appliance is provided, including an electric device and the above-mentioned switch levitation system. The magnetic levitation support mechanism, the magnetic detector means and the switch control circuit of the switch levitation system are arranged on or in a base, and the electric device is controlled by the switch control circuit over its switch modes.

The switch modes involve, but not limited to, power-on and power-off modes. For example, the switch modes may also involve a volume mode and a music selection mode when the electric device is a Bluetooth speaker, or involve a lamp light color conversion mode and a light intensity mode when the electric device is a color-changeable lamp.

According to the electrical appliance of the present invention, the electric device may be provided on the switch body of the switch levitation system or on the base, or even on both.

When the switch body is equipped with the electric device, a wireless power receiving coil powering the electric device may be disposed in the switch body, and a matching wireless power transmitting coil is disposed in the base, and a switch signal generated by the switch control circuit may be used to control powering of the wireless power transmitting coil, i.e., to turn on or off the power source connected thereto.

According to the electrical appliance of the present invention, the magnetic detector means of the switch levitation system is preferably further wire connected to the switch control circuit via a signal amplifier.

According to a preferred embodiment of the present invention, the electric device may be a lamp ring (such as of a wall lamp) pivotable to the base, and the switch body can freely cross over or go through the lamp ring during the pivoting movement of the lamp ring.

According to another preferred embodiment of the present invention, the electric device may be a light-emitting element disposed in the base that is tiltable through legs detachably connected thereto.

The Inventors thus achieve an ingenious, convenient as well as novel switch-shift operation by creatively taking advantage of the self-balancing adjustment capability of the magnetic levitation system, i.e., the switch levitating body can spontaneously return to its levitation balance position (without introduction of an extra structure such as a return spring) after forced operations within a certain degree, such as conveniently manual operations by push or press, while ingeniously in combination with a magnetic sensor, such as a Hall sensor of the magnetic levitation system per se, to prepare or generate a corresponding switch signal.

The multidimensional levitation switch or switch system of the present invention may be applied to various electrical appliances, including but not limited to any suitable household or other electrical appliances such as Bluetooth speakers, rice cookers, doorbells, electric lamps, etc. The shift of the switch modes of the electric device can be achieved readily by applying a simple push or press action on the switch levitating body, and thus operational convenience and novelty is introduced.

DETAILED DESCRIPTION OF PREFERRED EMBODIMENTS

The present invention will be further described with reference to embodiments and figures. Those skilled in the art should appreciate that those embodiments and figures are only for facilitating the understanding of the present invention, not for any limitations.

Figure 1:
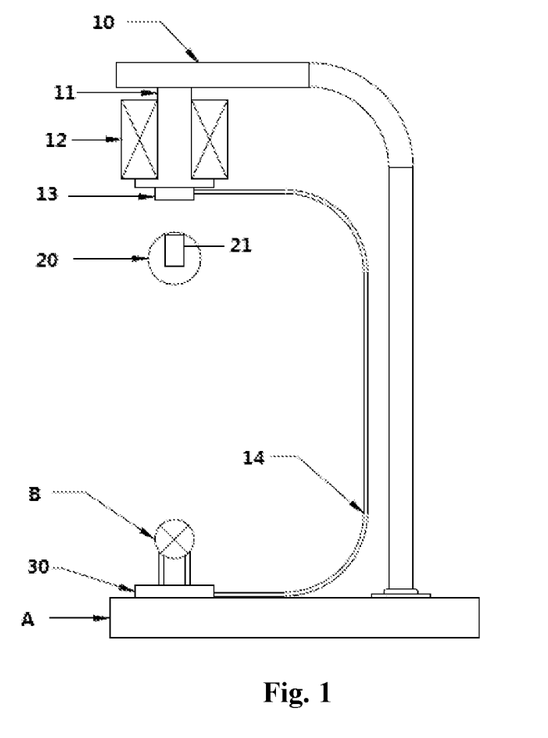
FIG. 1 is a structural schematic view of a first embodiment of a switch levitation system according to the present invention.

FIG. 1 shows an electrical appliance according to a first embodiment of the present invention, wherein an electric device B such as a bulb and a circuit board 30 are disposed on a base or a bottom of bracket A, and the circuit board 30 is provided with a switch control circuit for turning on or turning off power supply to the electric device B.

A magnetic levitation support mechanism 10 is disposed on the top of the bracket A. The magnetic levitation support mechanism 10 includes an iron core 11 and an electromagnetic coil 12 disposed around the iron core. A magnetic sensor (e.g., a Hall sensor) 13 is disposed at a lower end of the iron core 11. A cylindrical magnet 21 having opposite magnetic poles is disposed in a spherical levitating body 20. Certainly, a U-shaped magnet may also be used in this case.

There will be a magnetic attraction between the magnet 21 of the levitating body 20 and the iron core 11, and when a distance between the magnet 21 and the iron core 11 is adjusted appropriately (to a predetermined distance), the gravity of the levitating body 20 will be balanced by the magnetic attraction so that the levitating body 20 is in a balanced levitation position relative to the magnetic levitation support mechanism 10 or iron core 11. Once the distance between the magnet 21 of the levitating body 20 and the iron core 11 varies due to air disturbance, such a balanced levitation of the levitating body 20 relative to the magnetic levitation support mechanism 10 will be broken. The sensor 13 detects in real time a position variation of the levitating body 20 relative to the iron core 11 in a longitudinal direction (a vertical direction as shown), then generates a corresponding signal, and transmits the signal to a controller such as a control chip (not shown) disposed on the magnetic levitation support mechanism 10. The controller controls the flow direction and magnitude of an electric current flowing through the electromagnetic coil 12 based on the positional signal transmitted from the sensor 13, so that the electromagnetic coil 12 generates a corresponding electromagnetic force acting on the magnet 21 of the levitating body 20 to return it into the balanced levitation position. As for the structure and working principle of the magnetic attraction type levitation system, reference may be made to CN2561163Y, which is hereby incorporated by reference in its entirety.

Certainly, in such a magnetic levitation structure or system, the electromagnetic coil 12 is not limited to being arranged around the iron core 11, and it may also be arranged at the bottom of the bracket A so that the electromagnetic coil 12 is located below the levitating body 20 while being levitated. The levitating body 20 is not limited to a spherical shape and its magnet 21 is not limited to a cylindrical shape, for example, the whole levitating body 20 may be a magnet having opposite magnetic poles (in the vertical direction as shown). The sensor 13 is not limited to being arranged at the lower end of the iron core 11, and it may be arranged at any appropriate position such as on the bottom of the bracket A.

In the embodiment shown in FIG. 1, the sensor 13 also acts as magnetic detector means simultaneously, although other magnetic sensors may be separately or additionally introduced to function as the magnetic detector means. The sensor 13 in such a magnetic attraction type levitation system is usually a vertical component Hall sensor so as to detect variations of a vertical magnetic field component. A vertical component field intensity signal generated by the sensor 13 will be transmitted through a transmission line 14 to a switch control circuit on the circuit board 30. When receiving a vertical component field intensity signal that is above a set value, for example, when a hand slightly presses down or pushes up the levitating body 20 so that it deviates vertically away from the balanced levitation position by a certain distance of such as 1-2 mm without going beyond the self-balancing capability of the system (i.e., the levitating body is still capable of returning into its balanced levitation position upon hand release), the switch control circuit will generate a corresponding switch signal to turn on or turn off power supply to the electric device B. Thus control of power supply to the electric device B can be achieved by manual operation on the levitating body 20.

Figure 2:
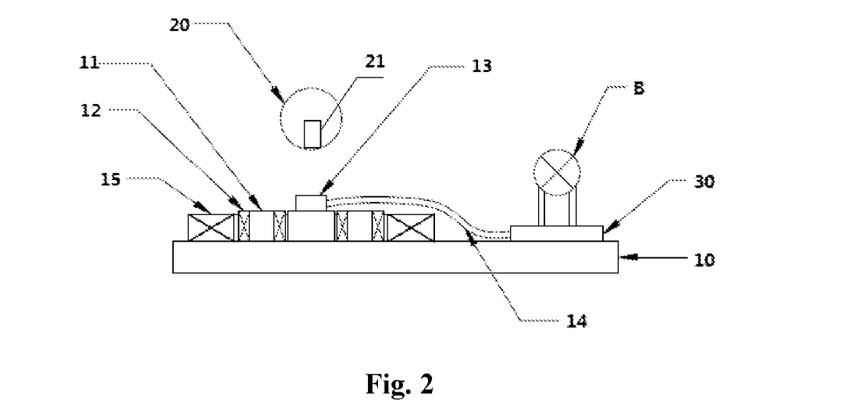
FIG. 2 is a structural schematic view of a second embodiment of a switch levitation system according to the present invention.

FIG. 2 shows an electrical appliance according to a second embodiment of the present invention, wherein the magnetic levitation support mechanism 10 is provided with an electric device B such as a bulb and a circuit board 30, and the circuit board 30 is provided with a switch control circuit for turning on or turning off power supply to the electric device B.

The magnetic levitation support mechanism 10 is further provided with an iron core 11 and an electromagnetic coil 12 disposed around the iron core. An annular magnet 15 is arranged around the electromagnetic coil 12. A magnetic sensor or Hall sensor 13 is disposed at a central position of the annular magnet 15. A cylindrical magnet 21 having opposite magnetic poles is disposed in a spherical levitating body 20.

There will be a magnetic repulsion between the magnet 21 of the levitating body 20 and the annular magnet 15, and when a distance between the magnet 21 and the annular magnet 15 is adjusted appropriately (to a predetermined distance), the gravity of the levitating body 20 will be balanced by the magnetic repulsion so that the levitating body 20 is in a balanced levitation position relative to the magnetic levitation support mechanism 10 or the annular magnet 15. The magnet 21 and the annular magnet 15 may be matched in the form of a smaller diameter cylindrical magnet and a larger diameter annular magnet with opposite magnetic poles adjacently facing each other as shown, or alternatively in the form of two substantially equal-diameter annular magnets with same magnetic poles adjacently facing each other. Once the distance between the magnet 21 of the levitating body 20 and the annular magnet 15 varies due to air disturbance, such a balanced levitation of the levitating body 20 relative to the magnetic levitation support mechanism 10 will be broken. The sensor 13 detects in real time a position variation of the magnet 21 of the levitating body 20 relative to the annular magnet 15 in a lateral direction (a horizontal direction as shown), then generates a corresponding signal, and transmits the signal to a controller such as a control chip (not shown) disposed on the magnetic levitation support mechanism 10. The controller controls the flow direction and magnitude of an electric current flowing through the electromagnetic coil 12 based on the positional signal transmitted from the sensor 13, so that the electromagnetic coil 12 and its reinforcing iron core 11 generates a corresponding electromagnetic force acting on the magnet 21 of the levitating body 20 to return it into the balanced levitation position. As for the structure and working principle of the magnetic repulsion type levitation system, reference may be made to such as the Applicant's early patents CN100544183C and CN105790641B, both of which are hereby incorporated by reference in their entireties.

Figure 3:
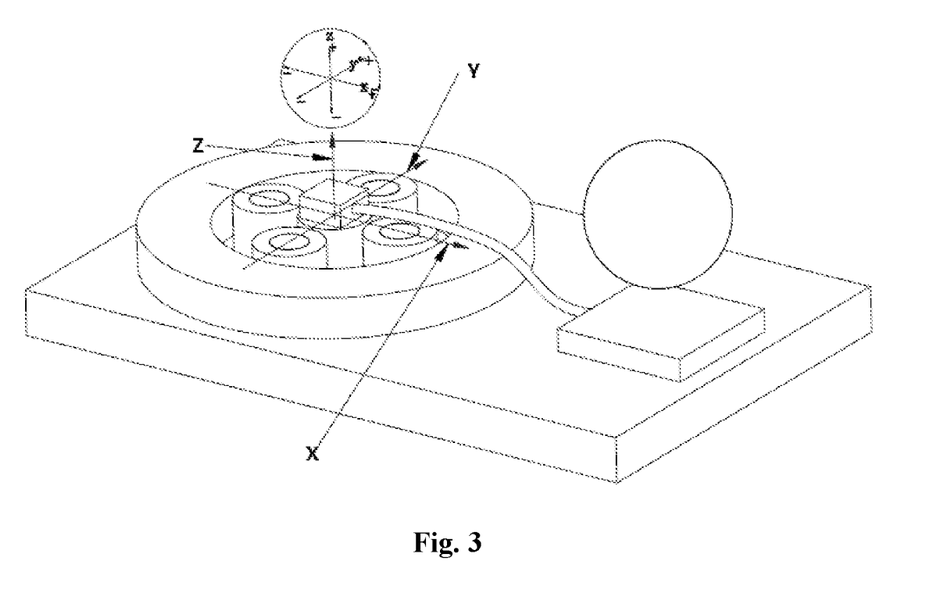
FIG. 3 is a schematic view for control of 3D movement of a switch levitating body of the embodiment shown in FIG. 2.

In the embodiment of the magnetic repulsion type levitation system shown in FIG. 2, the sensor 13 is usually a sensor assembly consisting of or integrated from horizontal component Hall sensors and a vertical component Hall sensor. As shown in FIG. 3, the horizontal component Hall sensors include an X-axis sensor and a Y-axis sensor, and the vertical component Hall sensor is a Z-axis sensor. For example, when the electric device B is a Bluetooth sound box, the vertical component Hall sensor or Z-axis sensor may be chosen to generate a main switch mode vector signal, the X-axis sensor may be chosen to generate a volume switch mode vector signal, and the Y-axis sensor may be chosen to generate a track-selection switch mode vector signal. As in the embodiment shown in FIG. 1, the switch mode vector signals (X⁺, X⁻, Y⁺, Y⁻, Z⁺ or Z⁻) generated by the sensor 13 will be transmitted through the transmission line 14 to the switch control circuit on the circuit board 30. Based on the switch mode vector signal received, the switch control circuit will generate a corresponding switch control signal to control an operation mode of the electric device B. Of course, it is also possible only to choose the Z-axis sensor to simply generate a switch signal.

Figure 4:
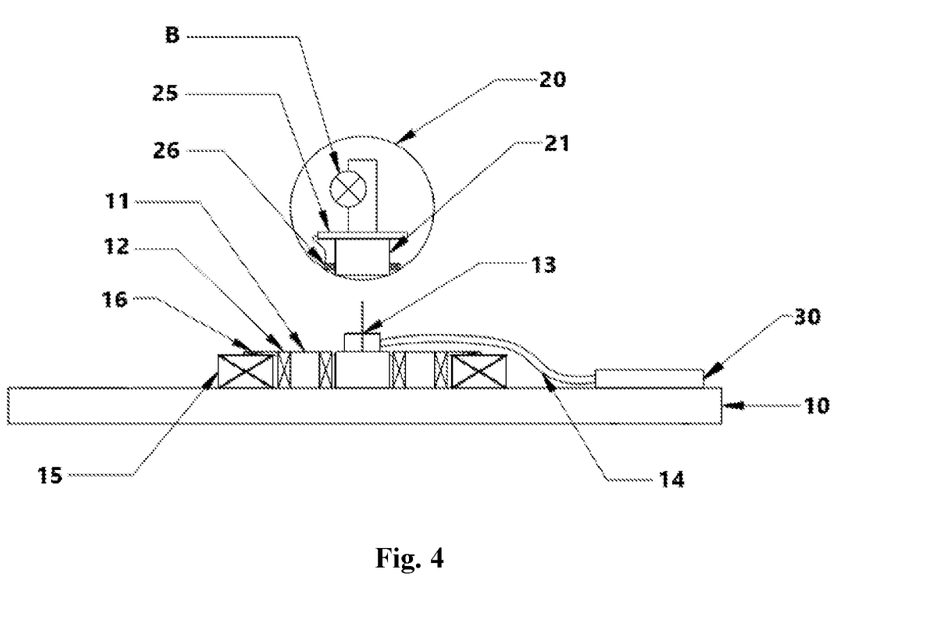
FIG. 4 is a structural schematic view of a third embodiment of a switch levitation system according to the present invention.

FIG. 4 shows an electrical appliance according to a third embodiment of the present invention, which is similar to the second embodiment but different in that the electric device B (a bulb as shown) while disposed together with the magnetic levitation support mechanism 10 in the second embodiment is now disposed in the levitating body 20.

In FIG. 4, an electric wireless power receiving coil 26 is also disposed in the levitating body 20 and connected with a rectifying circuit board 25 to power the electric device B. The magnetic levitation support mechanism 10 is correspondingly provided with an electric wireless power transmitting coil 16, and the switch circuit board 30 is devised to control the power supply to the electric wireless power transmitting coil 16. When the electric wireless power transmitting coil 16 is energized, a corresponding electric current is generated in the electric wireless power receiving coil 26. Such a wireless power supply structure is well known in the art and thus its working principle will not be discussed in detail here. As such, the shift of switch modes of the electric device B or indicator lamp in the levitating body 20 may be achieved by manual operation such as by slightly pressing the levitating body 20 as stated above.

Figure 5:
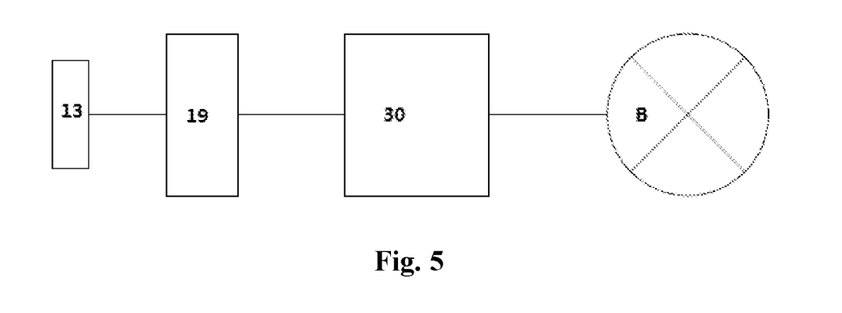
FIG. 5 is a flow chart of a circuit of the switch levitation system according to the present invention.

FIG. 5 shows a block diagram of a switch circuit according to the present invention. As shown, a certain magnetic field intensity signal detected by the sensor 13 is further amplified via a signal amplifier 19, and then transmitted to the switch control circuit on the circuit board 30. The switch control circuit may then generate a switch control signal for a corresponding power supply control or mode shift of the electric device B.

Certainly, the signal amplifier 19 may also be omitted or replaced by an existing signal amplifier already on the magnetic levitation support mechanism 10. In this case, the switch levitation system according to the present invention may be achieved by taking advantage of the self-balance-adjusting capability of the magnetic levitation system as well as its existing sensors and signal amplifier to be in connection with a certain switch circuit, without introducing any other elements such as a return spring.

Although the levitating body 20 is designed as a spherical shape, those skilled in the art may understand the levitating body 20 may, if needed, be designed as any desired configuration such as an eraser, a lighter, a globe or a toy of suitable sizes.

Figure 6:
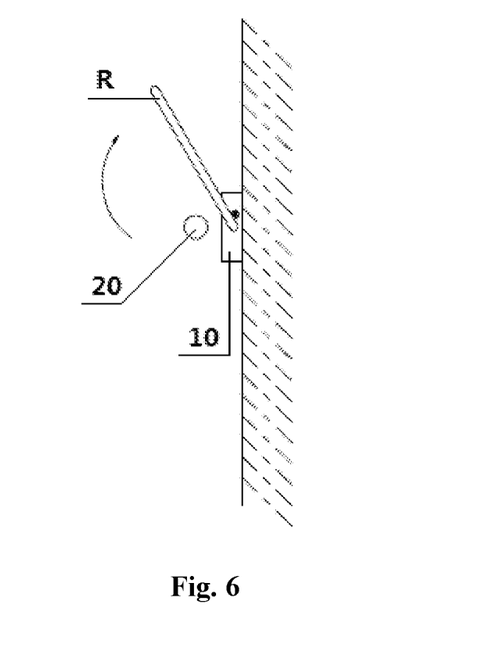
FIG. 6 is a structural schematic view in which the switch levitation system of the embodiment shown in FIG. 2 according to the present invention is applied to a wall lamp.

A wall lamp ring R shown in FIG. 6 is pivotable vertically relative to a magnetic levitation support mechanism 10. A levitating body 20 is levitated on a side of the magnetic levitation support mechanism 10 away from the wall, and may freely cross over or go through the wall lamp ring R without interfering therewith during folding or pivoting movement of the wall lamp ring R. Such a wall lamp is quite novel and convenient in use.

Figure 7:
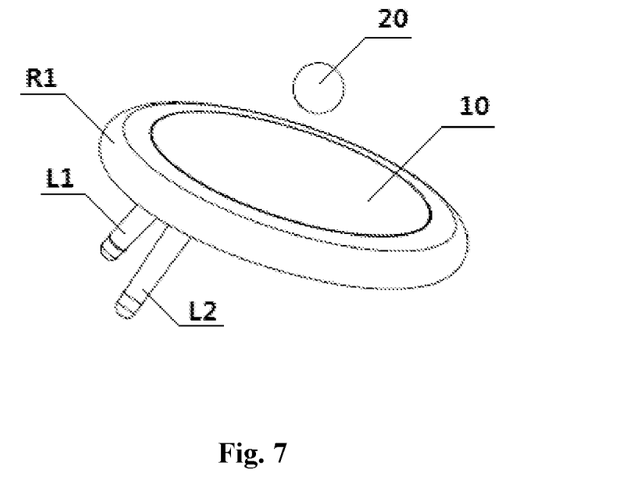
FIG. 7 is a structural schematic view in which the switch levitation system of the embodiment shown in FIG. 2 according to the present invention is applied to a table lamp.

FIG. 7 shows a table lamp including a base in which a light-emitting rim R1 is disposed around a magnetic levitation support mechanism 10, and a levitating body 20 over the base. Additionally, two optional legs L1 and L2 can be detachably connected to the base so as to make the base readily tiltable to a table top.

What is claimed is:

1. A switch levitation system, comprising:
a switch levitating body having a magnet;
a magnetic levitation support mechanism for supporting the switch body in a stably levitated state relative thereto;
magnetic detector means for detecting magnetic field variation of the switch body relative thereto and outputting a correspondingly varied magnetic signal; and
a switch control circuit receiving the varied magnetic signal output by the magnetic detector means, and generating a corresponding switch signal based on the varied magnetic signal received,
wherein said switch signal is used to control an electric device disposed on the switch body, and
wherein the magnetic detector means is configured to detect the magnetic field variation when the switch body is displaced in distance relative thereto.

2. The switch levitation system according to claim 1, wherein the distance between the magnetic detector means and the switch body is varied by manually pressing the switch body towards the magnetic detector means.

3. The switch levitation system according to claim 1, wherein the magnetic detector means is also configured to detect the magnetic field variation when the switch body is displaced parallel therewith, and the parallel displacement is achieved by pushing the switch body aside.

4. The switch levitation system according to claim 1, wherein the switch body is stably levitated above, below or on side of the magnetic levitation support mechanism.

5. The switch levitation system according to claim 1, wherein the magnetic detector means is arranged stationary to the magnetic levitation support mechanism.

6. The switch levitation system according to claim 1, wherein the magnetic detector means is part of the magnetic levitation support mechanism.

7. The switch levitation system according to claim 6, wherein the magnet of the switch body is a permanent magnet with opposite magnetic poles, the magnetic levitation support mechanism includes a substantially annular permanent magnet, an electromagnetic coil, a magnetic sensor assembly and a controller, the annular permanent magnet of the magnetic levitation support mechanism and the permanent magnet of the switch body form a substantially repulsively balanced magnetic field, the magnetic sensor assembly is configured to detect in real time a levitation balance position deviation of the permanent magnet of the switch body from the annular permanent magnet of the magnetic levitation support mechanism, the controller controls a corresponding electric current to flow through the electromagnetic coil based on the levitation balance position deviation detected by the magnetic sensor assembly so as to return the permanent magnet of the switch body to its relative levitation balance position, and wherein the magnetic sensor assembly of the magnetic levitation support mechanism functions also as the magnetic detector means.

8. The switch levitation system according to claim 6, wherein the magnet of the switch body is a permanent magnet with opposite magnetic poles, the magnetic levitation support mechanism includes a ferromagnetic element, an electromagnetic coil and a magnetic sensor, the ferromagnetic element and the permanent magnet of the switch body form a substantially attractively balanced magnetic field, the magnetic sensor is configured to detect in real time a levitation balance position deviation between the ferromagnetic element and the permanent magnet of the switch body, a corresponding electric current is controlled to flow through the electromagnetic coil based on the levitation balance position deviation detected by the magnetic sensor so as to return the permanent magnet of the switch body to its relative levitation balance position, and wherein the magnetic sensor of the magnetic levitation support mechanism functions also as the magnetic detector means.

9. An electrical appliance comprising an electric device and the switch levitation system according to claim 1, wherein the magnetic levitation support mechanism, the magnetic detector means and the switch control circuit of the switch levitation system are arranged on a base, and the electric device is disposed on the switch body and controlled by the switch control circuit over its switch modes.

10. The electrical appliance according to claim 9, further comprising another electric device which is disposed on the base of the switch levitation system and also controlled by the switch control circuit over its switch modes.

11. The electrical appliance according to claim 9, wherein the switch body is provided with a wireless power receiving coil powering the electric device, the base is provided with a wireless power transmitting coil matched with the wireless power receiving coil, and the switch signal generated by the switch control circuit is used to control powering of the wireless power transmitting coil.

12. An electrical appliance comprising:
a switch levitation system comprising:
a switch levitating body having a magnet;
a magnetic levitation support mechanism for supporting the switch body in a stably levitated state relative thereto;
magnetic detector means for detecting magnetic field variation of the switch body relative thereto and outputting a correspondingly varied magnetic signal; and
a switch control circuit receiving the varied magnetic signal output by the magnetic detector means, and generating a corresponding switch signal based on the varied magnetic signal received, and
an electric device disposed on the base of the switch levitation system, wherein the electric device is a lamp ring pivotable to the base, and the switch body can freely go through the lamp ring during the pivoting movement of the lamp ring.

13. An electrical appliance comprising:
a switch levitation system comprising:
a switch levitating body having a magnet;
a magnetic levitation support mechanism for supporting the switch body in a stably levitated state relative thereto;
magnetic detector means for detecting magnetic field variation of the switch body relative thereto and outputting a correspondingly varied magnetic signal; and
a switch control circuit receiving the varied magnetic signal output by the magnetic detector means, and generating a corresponding switch signal based on the varied magnetic signal received, and
an electric device disposed on the base of the switch levitation system, wherein the electric device is a light-emitting element disposed in the base that is tiltable through legs detachably connected thereto.

\* \* \* \* \*